United States Patent
Alexander et al.

(10) Patent No.: US 9,787,298 B2
(45) Date of Patent: Oct. 10, 2017

(54) OPERATION OF DOUBLE-BASE BIPOLAR TRANSISTORS WITH ADDITIONAL TIMING PHASES AT SWITCHING TRANSITIONS

(71) Applicant: Ideal Power Inc., Austin, TX (US)

(72) Inventors: William C. Alexander, Spicewood, TX (US); Richard A. Blanchard, Los Altos, CA (US)

(73) Assignee: Ideal Power, Inc., Austin, TX (US)

( * ) Notice: Subject to any disclaimer, the term of this patent is extended or adjusted under 35 U.S.C. 154(b) by 0 days.

(21) Appl. No.: 15/267,085

(22) Filed: Sep. 15, 2016

(65) Prior Publication Data

US 2017/0104478 A1    Apr. 13, 2017

Related U.S. Application Data

(63) Continuation-in-part of application No. PCT/US2015/061378, filed on Nov. 18, 2015.

(60) Provisional application No. 62/218,978, filed on Sep. 15, 2015, provisional application No. 62/239,815, filed on Oct. 9, 2015, provisional application No. 62/081,474, filed on Nov. 18, 2014, provisional application No. 62/094,435, filed on Dec. 19, 2014, (Continued)

(51) Int. Cl.
| | |
|---|---|
| H01L 29/73 | (2006.01) |
| H03K 17/06 | (2006.01) |
| H01L 29/16 | (2006.01) |
| H01L 29/735 | (2006.01) |
| H01L 27/06 | (2006.01) |
| H01L 29/10 | (2006.01) |
| H01L 29/08 | (2006.01) |
| H03K 17/66 | (2006.01) |
| H03K 17/68 | (2006.01) |
| H01L 29/747 | (2006.01) |

(52) U.S. Cl.
CPC ......... *H03K 17/06* (2013.01); *H01L 27/0694* (2013.01); *H01L 29/0808* (2013.01); *H01L 29/0821* (2013.01); *H01L 29/1008* (2013.01); *H01L 29/16* (2013.01); *H01L 29/735* (2013.01); *H01L 29/747* (2013.01); *H03K 17/665* (2013.01); *H03K 17/68* (2013.01); *H03K 2217/0054* (2013.01); *H03K 2217/0063* (2013.01); *H03K 2217/0072* (2013.01)

(58) Field of Classification Search
USPC .......................................................... 327/109
See application file for complete search history.

(56) References Cited

U.S. PATENT DOCUMENTS 5,977,569 A * 11/1999 Li .................. H03K 17/567
                                                      257/119
7,605,446 B2 * 10/2009 Udrea ................ H01L 29/0657
                                                      257/341

(Continued)

*Primary Examiner* — Lincoln Donovan
*Assistant Examiner* — Patrick Chen
(74) *Attorney, Agent, or Firm* — Groover & Associates PLLC; Robert O. Groover, III; Gwendolyn G. Corcoran (57) ABSTRACT

Methods and systems for operating a double-base bidirectional power bipolar transistor. Two timing phases are used to transition into turn-off: one where each base is shorted to its nearest emitter/collector region, and a second one where negative drive is applied to the emitter-side base to reduce the minority carrier population in the bulk substrate. A diode prevents reverse turn-on while negative base drive is being applied.

21 Claims, 7 Drawing Sheets

Related U.S. Application Data provisional application No. 62/236,492, filed on Oct. 2, 2015.

(56) References Cited

U.S. PATENT DOCUMENTS

| | | | |
|---|---|---|---|
| 2008/0013351 A1* | 1/2008 | Alexander | H02M 3/1582 363/123 |
| 2008/0122517 A1* | 5/2008 | Pichler | H03K 17/60 327/483 |
| 2011/0292697 A1* | 12/2011 | Alexander | H02M 5/275 363/37 |

* cited by examiner

OPERATION OF DOUBLE-BASE BIPOLAR TRANSISTORS WITH ADDITIONAL TIMING PHASES AT SWITCHING TRANSITIONS

CROSS-REFERENCE

Priority is claimed from 62/218,978 filed Sep. 15, 2015, and from 62/239,815 filed Oct. 9, 2015, both of which are hereby incorporated by reference. Priority is also claimed (where available) from copending PCT application WO/2016/081623, and therethrough from U.S. provisional applications 62/081,474 filed Nov. 18, 2014, 62/094,435 filed Dec. 19, 2014, 62/236,492 filed Oct. 2, 2015, and 62/239,815 filed Oct. 9, 2015.

BACKGROUND

The present application relates to double-base bipolar transistors and circuits and systems including them, and to methods for operating such transistors and circuits and systems.

Note that the points discussed below may reflect the hindsight gained from the disclosed inventions, and are not necessarily admitted to be prior art.

Application Ser. No. 14/313,960 (now issued as U.S. Pat. No. 9,029,909, and hereby incorporated by reference) disclosed bidirectional bipolar transistors known as "B-TRANs," and methods for operating such transistors. Further improvements, applications, and implementations were disclosed in subsequent commonly-owned and co-pending patent applications, including e.g. US/2016-0141375, US/2016-0173083, WO/2016-112395, and US/2016-0241232, all of which are hereby incorporated by reference.

The most basic B-TRAN is a four-terminal three-layer power device. In the most basic version, each side of a p-type monolithic semiconductor wafer has an n-type emitter/collector region and a p-type base contact region. The two base regions are contacted separately, and the two emitter/collector regions are connected to provide the two current-carrying terminals. This example can operate, in either direction of current flow, as an NPN bipolar transistor.

The polarity of the externally applied voltage will determine which of the emitter/collector regions is operating as the emitter (i.e. is emitting electrons, in this NPN example), and which is operating as the collector. The two base regions are not connected together, but are operated separately: in describing the operation of this class of devices, the base region on the same surface as the collector will normally be referred to as the "c-base," and the base region on the same surface as the emitter will normally be referred to as the "e-base." (Of course, when the external polarity reverses, the functions of the two emitter/collector regions will be exchanged: the collector will become the emitter, the emitter will become the collector, the e-base will become the c-base, and the c-base will become the e-base.)

The methods of operation described in the U.S. Pat. No. 9,029,909 patent, and in the published applications listed above, result in a fully bidirectional switching device which provides high gain, high breakdown voltage, and low voltage drop in the ON state. This combination of advantages is extremely advantageous.

To achieve this combination of advantages, an operation sequence was disclosed which included a pre-turnoff timing phase as well as a preliminary turn-on phase (known as "diode turn-on"). The principles of operation are very different from those of conventional bipolar power transistors, as may be seen from the following description.

A B-TRAN is in the "active off-state" when the e-base (base on the emitter side) is shorted to the emitter, and the c-base (base on the collector side) is open. In this state, with the NPN B-TRAN, the collector is the anode (high voltage side), and the emitter is the cathode (low voltage side).

The B-TRAN is also off when both bases are open, but due to the high gain of the B-TRAN in this state, the breakdown voltage is low. The series combination of a normally-ON JFET and a Schottky diode attached between each base on its respective emitter/collector, as previously disclosed, will significantly increase the blocking voltage in this "passive off-state". The JFETs are turned off during normal operation.

The e-base is essentially at a constant voltage—it varies only about 0.1 V from a low drive to a high drive condition. The c-base, in contrast, is a nearly constant current drive, even as the voltage is varied from 0 V above the collector to about 0.6 V. Instead of the c-base current changing with c-base voltage, Vce changes. At a c-base voltage of 0 V (c-base shorted to collector), there is a certain gain that depends on the emitter current density, and Vce is nominally 0.9 V over a large range of current density. Raising the c-base to 0.1 V above the collector does not change the gain, but it lowers Vce by nominally 0.1 V. Raising the c-base to 0.6V drops Vce to about 0.2 or 0.3 V.

One sample embodiment for B-TRAN turn-on is to simultaneously, from the active off-state and blocking forward voltage, open the e-base-to-emitter short while shorting the c-base to the collector. This immediately introduces charge carriers into the highest field region of the depletion zone around the collector/base junction, so as to achieve very fast, forward biased turn-on for hard switching, very similar to IGBT turn-on.

Another advantageous turn-on method, from the active off-state, is to have the circuit containing the B-TRAN reverse the B-TRAN polarity, which produces the same base state described in the hard turn-on method, but at near zero voltage. That is, the e-base which is shorted to the emitter becomes the c-base shorted to the collector as the B-TRAN voltage reverses from the active off-state polarity. Again, turn-on is fast.

In a third turn-on method from the active off-state, the e-base is disconnected from the emitter, and connected to a current or voltage source of sufficient voltage to inject charge carriers into the base region. This method is likely slower, since the charge carriers go into the base just below the depletion zone. Also, it is known that carrier injection into the e-base results in inferior gain relative to carrier injection into the c-base.

After turn-on is achieved with either of the methods using the c-base, Vce is more than a diode drop. To drive Vce below a diode drop, turn-on goes to the second stage of increased charge injection into the c-base via a voltage or current source. The amount of increased charge injection determines how much Vce is reduced below a diode drop. Injection into the e-base will also reduce Vce, but the gain is much lower than with c-base injection.

In the first step of one advantageous turn-off method, the c-base is disconnected from the carrier injection power supply and shorted to the collector, while the previously open e-base is shorted to the emitter. This results in a large current flow between each base and its emitter/collector, which rapidly removes charge carriers from the drift region. This in turn results in a rising Vce as the effective resistivity of the drift region increases. At some optimum time after the bases are shorted, the connection between the c-base and the collector is opened, after which Vce increases rapidly as the depletion region forms around the collector/base junction.

Turn-off can be achieved by simply opening the c-base and shorting the e-base to the emitter, but this will result in higher turn-off losses since the drift region (base) will have a high level of charge carriers at the start of depletion zone formation.

Turn-off can also be achieved by simply opening the c-base and leaving the e-base open, but this will result in the highest turn-off losses and also a low breakdown voltage.

The present application teaches, among other innovations, new improvements to methods of operating a B-TRAN-type device, and new circuits which perform these improved methods. The present application also teaches, among other innovations, circuits and systems which incorporate a device with improved operation as above, and methods for operating such circuits and systems. A particularly beneficial feature is the introduction of an additional pre-turnoff timing phase, as described below. This additional timing phase reduces the minority carrier population, resulting in faster quenching of bipolar conduction.

In one example of an NPN B-TRAN device, turn-off begins with a pre-turnoff stage as before, where each base contact region is shorted to its adjacent emitter/collector region. However, according to the additional disclosure in the present application, this first pre-turnoff stage is followed by a second pre-turnoff timing phase, where negative drive is applied to the e-base (i.e. to the base contact region on the same side as the emitter, which is the more negative of the two emitter/collector regions). This negative drive reduces the population of holes in the bulk base (which is the p-type bulk of the semiconductor material). Since the population of holes is reduced, secondary emission of electrons from the collector junction is also necessarily reduced, and the non-equilibrium ON-state carrier concentration moves toward its equilibrium value. (The nonequilibrium carrier concentration can be orders of magnitude greater than its equilibrium value.)

Some of the disclosed base drive circuits provide this second pre-turnoff timing phase very easily, since the base drive circuits disclosed in previous applications already included elements which provided the voltage offset which is exploited here to provide negative base drive (for an NPN device; of course, polarities are reversed in a PNP device).

The innovative teachings provide the benefit, among others, of faster turn-off, and correspondingly less energy loss, in double-base bipolar transistors.

The innovative teachings also provide more efficient switching of phase legs (and analogous configurations). When two transistors are connected in series between two supply lines, the transistor which is turning off (during switching) will turn off faster during its reverse recovery: this reduces the current which would pass through the other transistor of the phase leg while it is turning on.

Further inventive features and advantages are set forth in the following description.

BRIEF DESCRIPTION OF THE DRAWINGS

The disclosed inventions will be described with reference to the accompanying drawings, which show important sample embodiments and which are incorporated in the specification hereof by reference, wherein.

DETAILED DESCRIPTION OF SAMPLE EMBODIMENTS

The numerous innovative teachings of the present application will be described with particular reference to presently preferred embodiments (by way of example, and not of limitation). The present application describes several inventions, and none of the statements below should be taken as limiting the claims generally.

The present application teaches that B-TRANs can advantageously be driven using negative base drive circuits like those seen in the sample embodiments, and their equivalents. For an NPN B-TRAN, the negative base drive is applied to the "e-base" (i.e. the base contact region on the emitter side, where the more negative external voltage appears), and draws holes out of the p-type bulk base.

Figure 1:
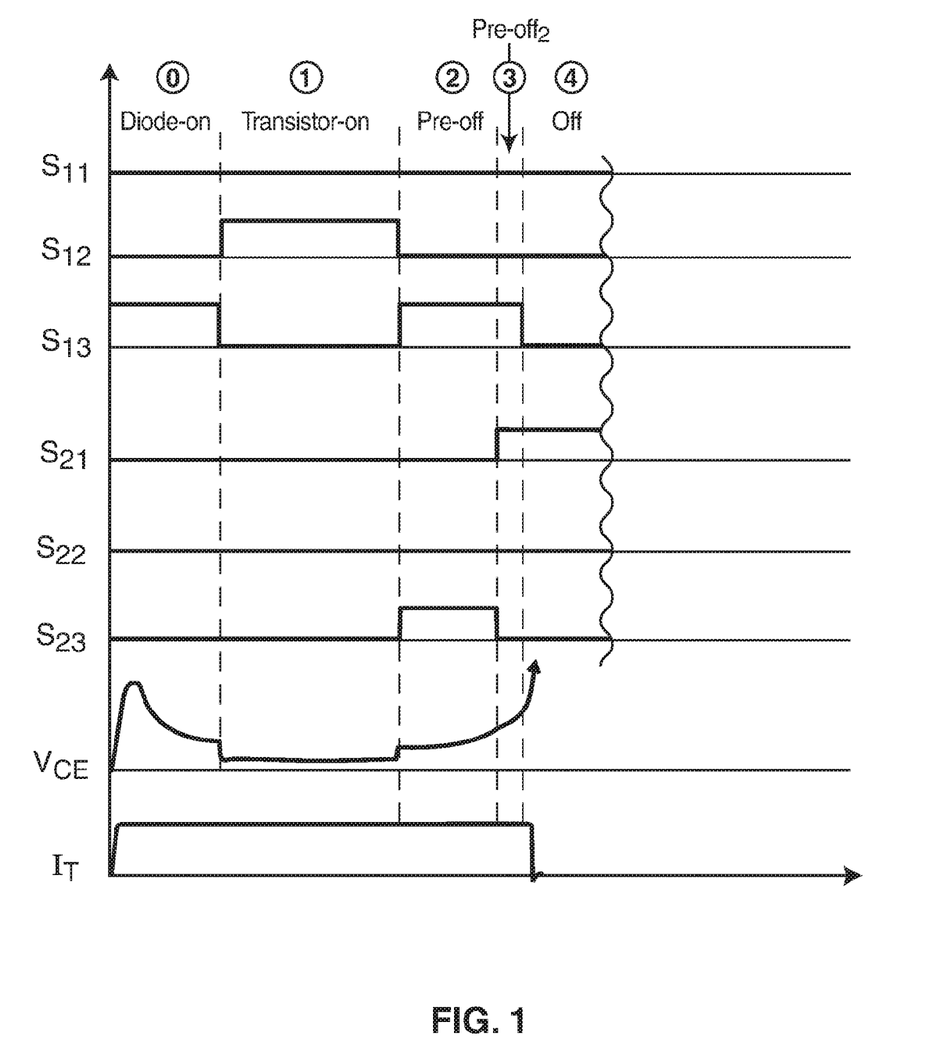
FIG. 1 shows waveform plots for one sample embodiment of turn-off switching using e.g. a base drive circuit like that of FIG. 2.
Figure 2:
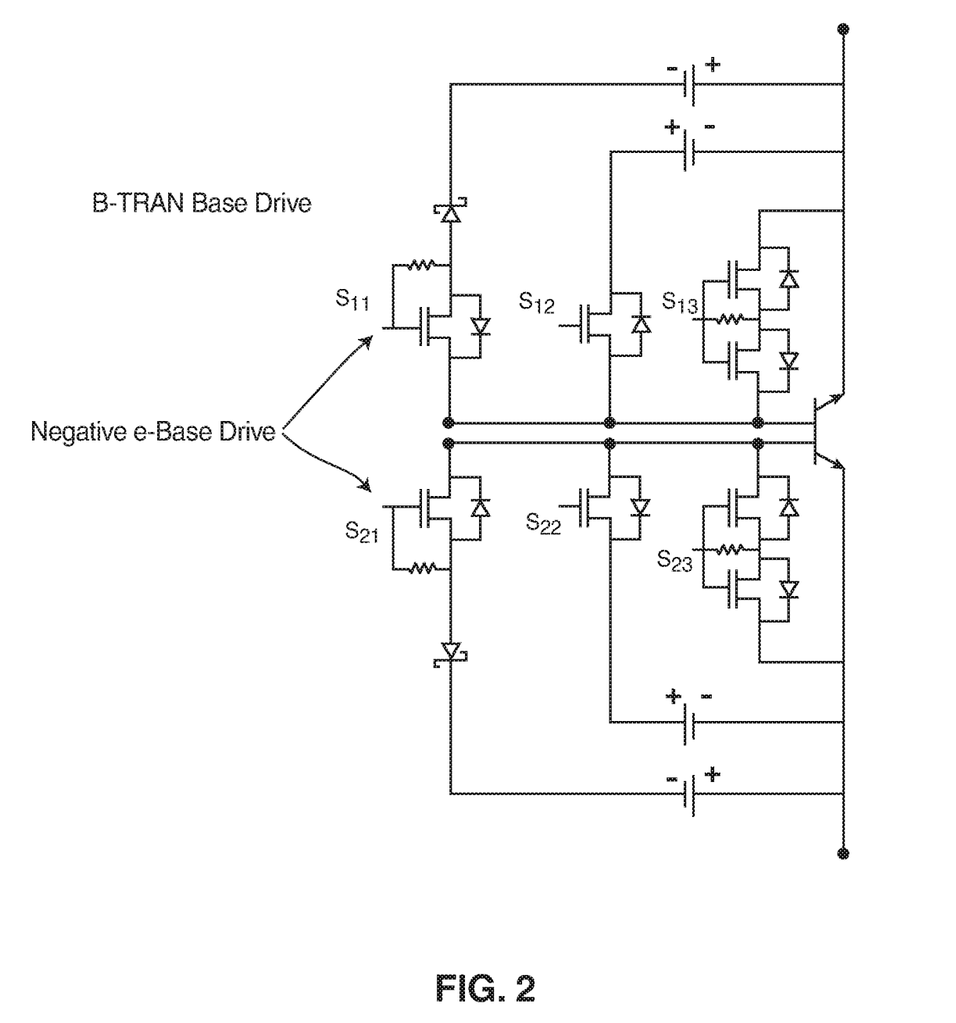
FIG. 2 shows a sample B-TRAN base drive with two negative e-base drive modules (one for either base contact region).

FIG. 2 shows an example of a base drive circuit connected to a B-TRAN. (Typically the B-TRAN will be a discrete power device.) Note generally that three circuit legs are connected to each of the two base contacts of the B-TRAN. One leg (switch $S_{13}$ or switch $S_{23}$) uses back-to-back devices to provide bidirectional conduction, but does not include an added voltage offset. This leg provides the connections for the "diode-on" mode (timing phase 1 of FIG. 1) and for the first pre-off stage (timing phase 3 of FIG. 1).

The other two legs include voltage offsets, as described in the previous applications referenced above. Note that the body diode of switch $S_{21}$ is opposite to that of switch $S_{22}$, and the voltage offsets in series with these two switches have different polarities. (Similarly, $S_{11}$ and $S_{12}$ are oppositely configured.) One Schottky diode is connected in series with $S_{21}$, and another with $S_{11}$.

The function of the Schottky diode is as follows. The circuit of

Figure 7:
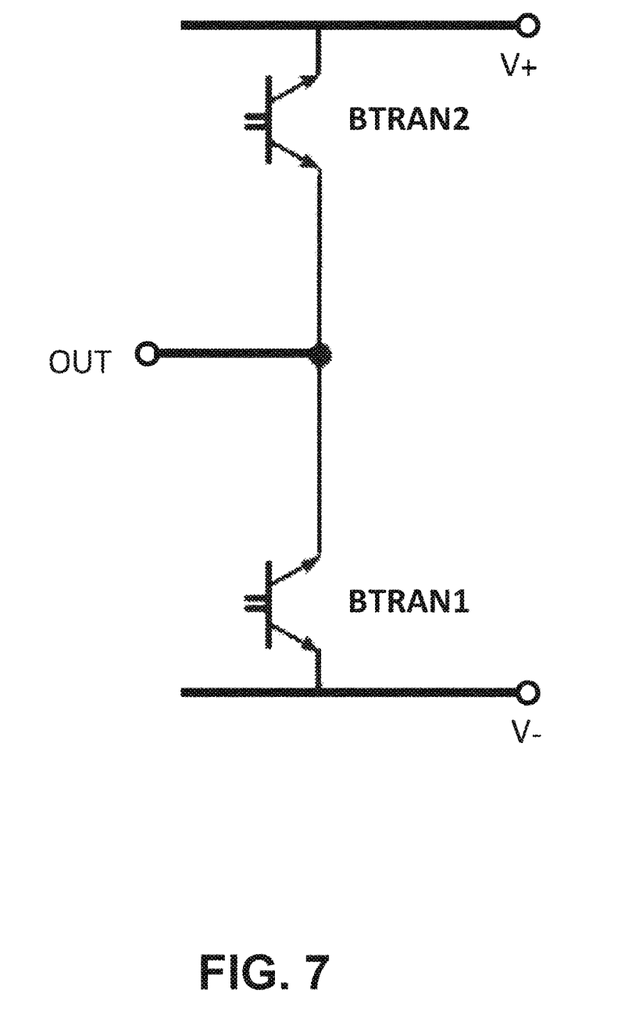
FIG. 7 shows a phase leg configuration which is discussed for illustration of the Schottky diode's function.

FIG. 7 shows a simple circuit configuration for illustration: Suppose that two NPN B-TRAN devices, BTRAN1 and BTRAN2, are connected in series between two supply rails V+ and V− to form a phase leg with an output node OUT. In such a configuration, only one of the B-TRAN devices is allowed to be fully ON at any given instant. Assume that BTRAN1 is connected between the output node and whichever rail is negative (at the moment), and BTRAN2 is connected between the output node and whichever rail is positive (at the moment). Now consider the transition when the phase leg is switched, so that the OUT node is to be pulled up rather than pulled down.

The pulldown device BTRAN1 will turn off, and the pullup device BTRAN2 will turn on. This means that BTRAN1 will go into reverse recovery. Just prior to reverse recovery of a B-TRAN operating as a diode (BTRAN1), the device is prepared for reverse recovery by first shorting the e-base to the emitter for pre-off-1, then the e-base is connected to a voltage negative with respect to the emitter (negative e-base drive) in order to complete the removal of charge carriers from the bulk base region (during phase 4, pre-off-2), then due to turn-on of the other B-TRAN in the phase leg the current reverses in B-TRAN-1, whereupon the emitter changes to collector, and e-base changed to c-base, and that device starts blocking voltage from collector to emitter. This causes the c-base voltage to drop below the collector, and also below the negative e-base drive. The Schottky diode prevents current flow from the negative e-base drive to the c-base, which, if it happened, would prevent B-TRAN-1 from blocking voltage.

FIG. 1 shows waveform plots for one sample embodiment of turn-off switching using e.g. a base drive circuit like that of FIG. 2. Note that, instead of the single pre-turnoff timing phase disclosed in previous applications, two pre-turnoff timing phases appear here. The two pre-turnoff timing phases are labeled as "Pre-off$_1$" (or phase 2) and "Pre-off$_2$" (or phase 3).

In the stage labeled "Pre-off$_2$", switch $S_{21}$ turns on, briefly driving the e-base negative just before turn-off (which occurs in phase 5). This reduces turn-off losses.

The first timing phase illustrated (phase 0) is the "diode-on" mode. Here switch $S_{13}$ is connecting the c-base to the collector. This results in conduction subject to a "diode drop" (about 0.9V for silicon) of forward bias.

The second timing phase illustrated (phase 1) is the "transistor-on" mode. Here switch $S_{12}$ is connecting the c-base to a positive voltage with respect to the collector. This results in conduction subject to a very small forward bias (e.g. 200 mV or so of $V_{CE}$).

The third timing phase illustrated is the pre-turnoff timing phase "Pre-off$_1$" (or phase 2). In this timing phase both of the base contact regions are shorted to their adjacent emitter/collector regions.

The fourth timing phase illustrated is the second pre-turnoff timing phase "Pre-off$_2$" (or phase 3). In this timing phase the e-base is driven to reduce conduction; in a PNP device a negative drive is applied to the e-base, as described above.

The last timing phase illustrated is the "active-off" timing phase (phase 4). In this timing phase both of the base contact regions are shorted to their adjacent emitter/collector regions.

Figure 3:
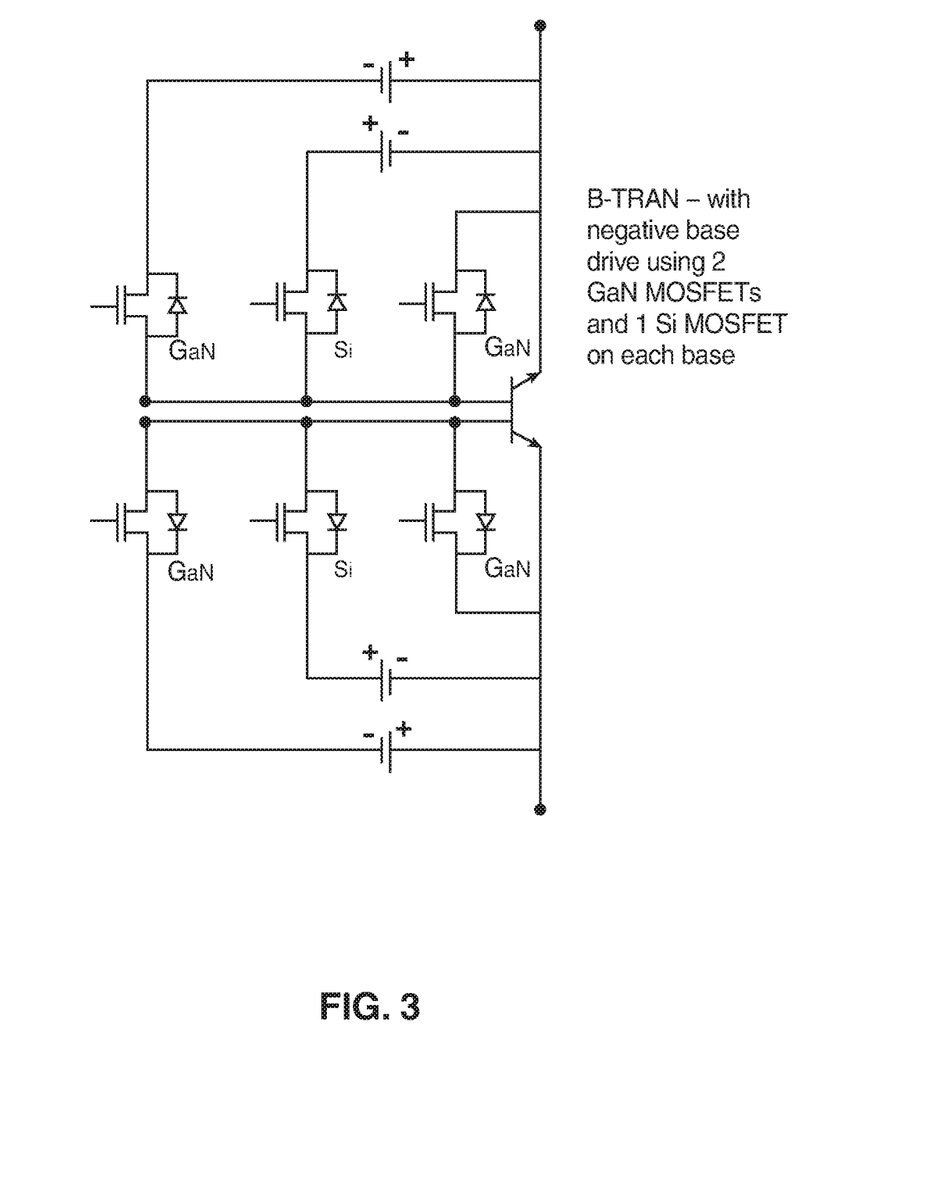
FIG. 3 shows another negative base drive circuit which can operate a B-TRAN.

FIG. 3 shows another negative base drive circuit, which operates a B-TRAN (silicon in this example) using two GaN MOSFETs and one Si MOSFET on each base. Since the bandgap of GaN is higher than Si, the larger diode drop voltage (of the body diode) of the GaN MOSFETs provides a differential with respect to the body diodes of the silicon devices.

Figure 4:
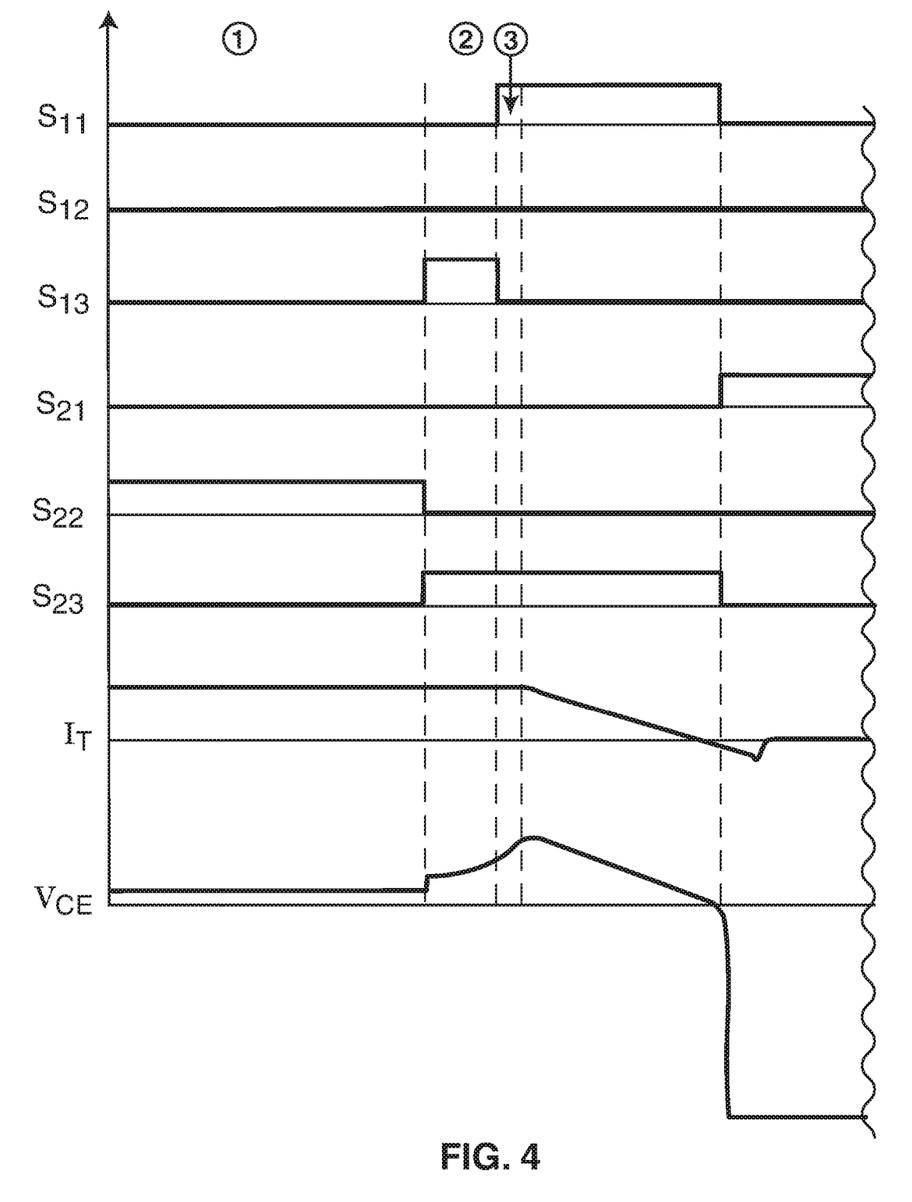
FIG. 4 shows waveform plots for one sample embodiment of reverse recovery switching using a negative base drive.

FIG. 4 shows waveform plots for one sample embodiment of reverse recovery switching for a negative base drive like e.g. that of FIG. 2. Here, the negative base drive briefly pulls the e-base negative to reduce turn-on and reverse recovery losses.

Figure 5:
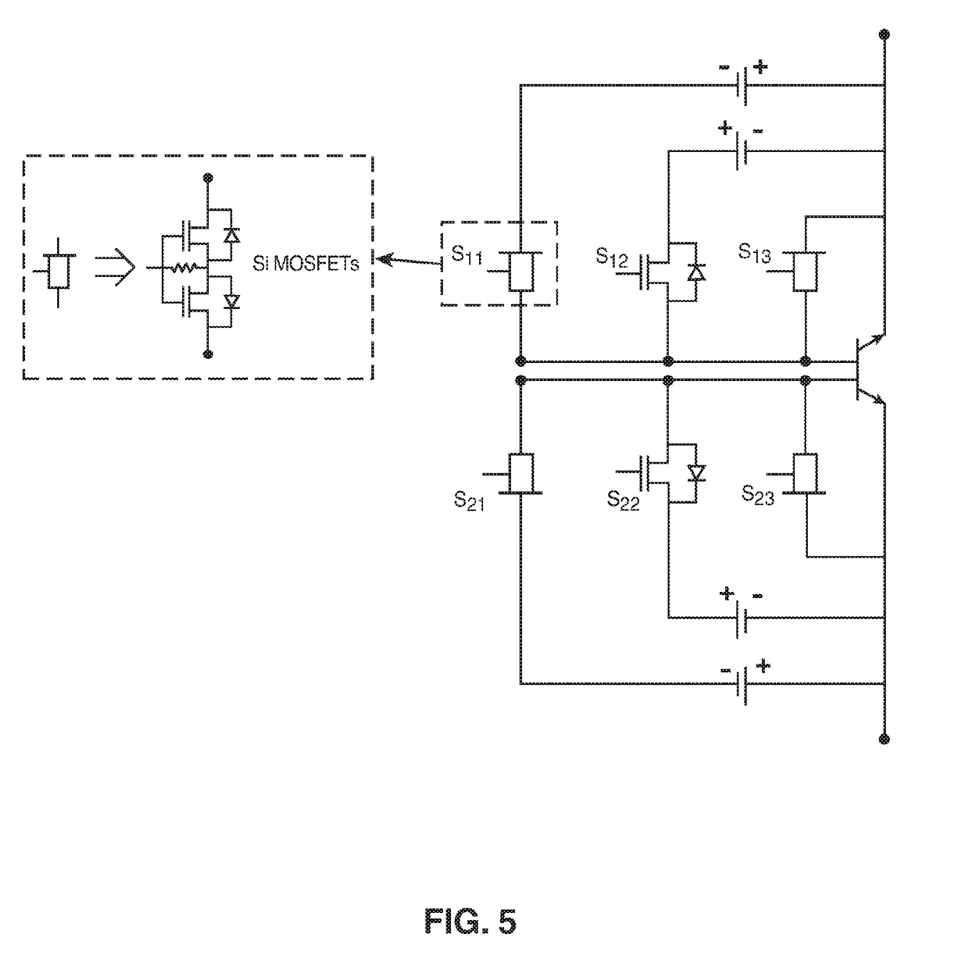
FIG. 5 shows another negative base drive circuit which operates a B-TRAN.

FIG. 5 shows another negative base drive circuit, which operates a B-TRAN using two Si MOSFET pairs and one Si MOSFET on each base.

Figure 6:
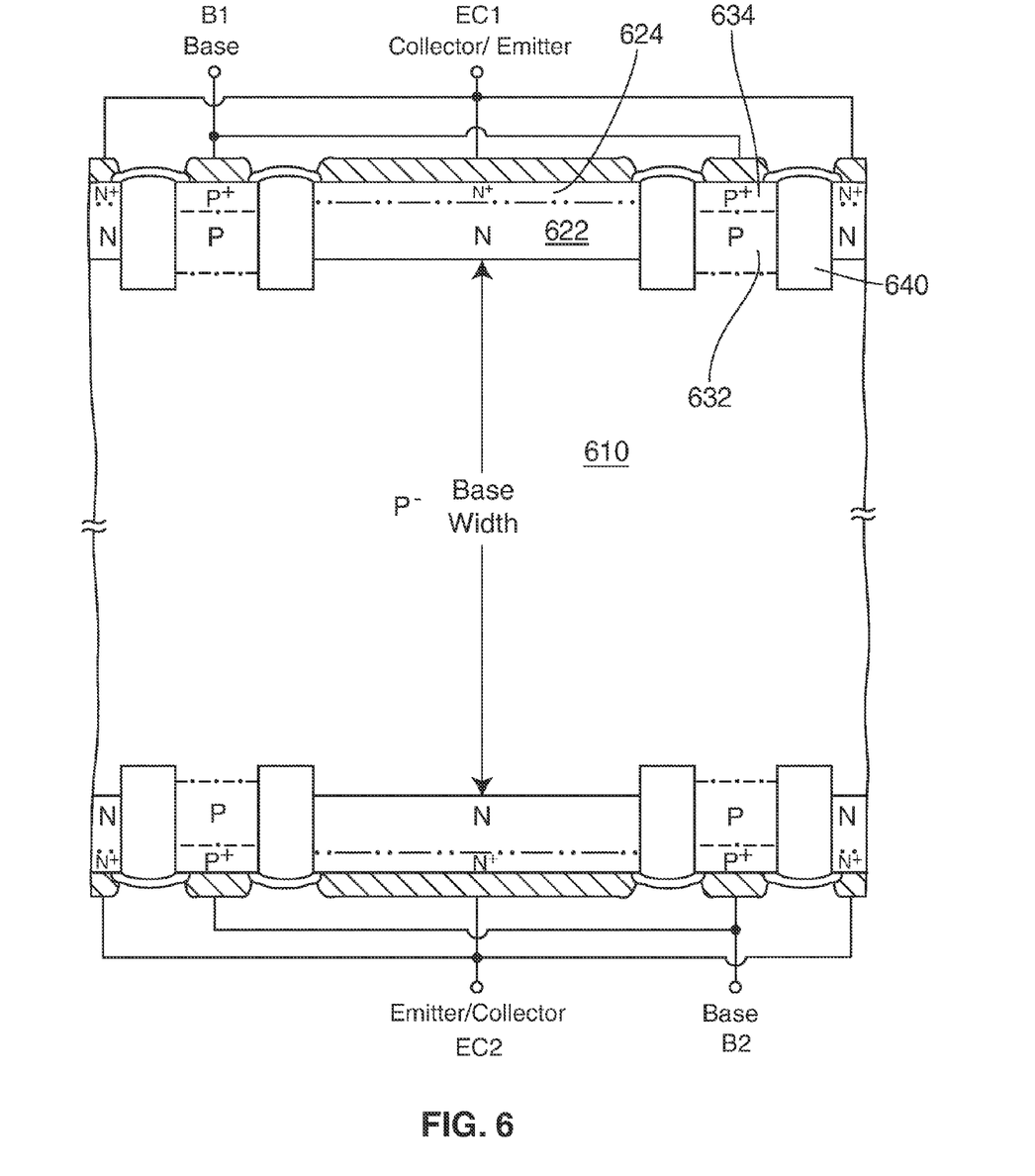
FIG. 6 shows an example of a B-TRAN device structure.

FIG. 6 shows an example of a B-TRAN device structure. In this Figure, both faces of a semiconductor die 610 carry emitter/collector regions 622 which form a junction with the bulk substrate 610. Base contact regions 632 are also present on both faces. This example shows an NPN structure, so the emitter/collector regions 622 are n-type, and the base contact regions 632 are p-type. A shallow n+ contact doping 624 provides ohmic contact from separate terminals EC1 and EC2 (on the two opposite faces of the semiconductor die, in this example) to regions 622, and a shallow p+ contact doping 634 provides ohmic contact from separate terminals B1 and B2 (on the two opposite faces of the die) to regions 632. In this example, dielectric-filled trenches 640 provide lateral separation between base contact regions 632 and emitter/collector regions 622. (Note that a p-type diffused region may be added to reduce the series resistance between the emitter-to-base junction and the base contact.) B-TRANs can provide significantly better efficiency than is conventionally available for existing static transfer switches; for example, a 1200V B-TRAN has an expected system efficiency of 99.9%.

Advantages

The disclosed innovations, in various embodiments, provide one or more of at least the following advantages. However, not all of these advantages result from every one of the innovations disclosed, and this list of advantages does not limit the various claimed inventions.

Faster reverse recovery;
Faster turn-off;
Reduced switching losses;
Phase legs with reduced losses; and
Improved efficiency in power conversion systems.

According to some but not necessarily all embodiments, there is provided: Methods and systems for operating a double-base bidirectional power bipolar transistor. Two timing phases are used to transition into turn-off: one where each base is shorted to its nearest emitter/collector region, and a second one where negative drive is applied to the emitter-side base to reduce the minority carrier population in the bulk substrate. A diode prevents reverse turn-on while negative base drive is being applied.

According to some but not necessarily all embodiments, there is provided: A method for operating a bidirectional bipolar power transistor which has two distinct n-type emitter/collector regions on opposite faces of a p-type semiconductor die, and two distinct p-type base contact regions on the opposite faces of the die, comprising: 1) in a transistor-ON timing phase, when minimal voltage drop is desired, biasing a first one of the base contact regions, which is closest to whichever of the emitter/collector regions is more positive at the moment, to a voltage which causes bipolar conduction, to thereby reduce the voltage drop between the two emitter/collector regions; and thereafter 2) in a first pre-turnoff timing phase, shorting each of the base contact regions to the respectively nearest one of the emitter/collector regions, to thereby increase the voltage drop between the two emitter/collector regions; and thereafter 3) in a second pre-turnoff timing phase, biasing the second base contact regions negative with respect to its nearest emitter/collector region, to thereby reduce the minority carrier concentration in the bulk base region.

According to some but not necessarily all embodiments, there is provided: A method for operating a bidirectional bipolar power transistor which has two distinct n-type emitter/collector regions on opposite faces of a p-type semiconductor die, and two distinct p-type base contact regions on the opposite faces of the die, comprising, when a first one of the emitter/collector regions is more positive than a second one of the emitter/collector regions: 0) in a diode-ON timing phase, shorting a first one of the base contact regions to the first emitter/collector region, which is the nearest thereto, to thereby initiate conduction between the two emitter/collector regions; and thereafter 1) in a transistor-ON timing phase, when minimal voltage drop is desired, biasing the first base contact region to a voltage which causes bipolar conduction, to thereby reduce the voltage drop between the two emitter/collector regions; and thereafter 2) in a first pre-turnoff timing phase, shorting each of the base contact regions to the respectively nearest one of the emitter/collector regions, to thereby increase the voltage drop between the two emitter/collector regions; and thereafter 3) in a second pre-turnoff timing phase, biasing the second base contact regions negative with respect to the second emitter/collector region; and thereafter 4) shorting the second base contact region to the second emitter/collector region, to keep the device turned off.

According to some but not necessarily all embodiments, there is provided: A method for operating a bidirectional bipolar transistor which has two first-conductivity-type emitter/collector regions in distinct locations separated by a bulk second-conductivity-type base region, and two distinct second-conductivity-type base contact regions which connect to the bulk base region in mutually separate locations, comprising: 1) in a transistor-ON timing phase, when minimal voltage drop is desired, biasing a first one of the base contact regions, which is closer than a second one of the base contact regions to whichever of the emitter/collector regions is positioned to act as the collector, as defined by externally applied voltage polarity, to a voltage which causes bipolar conduction to reduce the voltage drop between the two emitter/collector regions; and thereafter 2) in a first pre-turnoff timing phase, shorting each of the base contact regions to the respectively nearest one of the emitter/collector regions; and thereafter 3) in a second pre-turnoff timing phase, biasing the second base contact regions with a polarity opposite to that applied to the first base contact region in step 1), to thereby reduce the minority carrier concentration in the bulk base region; and thereafter 4) turning the device off.

According to some but not necessarily all embodiments, there is provided: A method for operating a bidirectional bipolar power transistor which has two distinct n-type emitter/collector regions on opposite faces of a p-type semiconductor die, and two distinct p-type base contact regions on the opposite faces of the die, comprising: 1) in a transistor-ON timing phase, when minimal voltage drop is desired, biasing a first one of the base contact regions, which is closest to whichever of the emitter/collector regions is more positive at the moment, to a voltage which causes bipolar conduction, to thereby reduce the voltage drop between the two emitter/collector regions; and thereafter 2) in a first pre-turnoff timing phase, shorting each of the base contact regions to the respectively nearest one of the emitter/collector regions, to thereby increase the voltage drop between the two emitter/collector regions; and thereafter 3) in a second pre-turnoff timing phase, biasing the second base contact regions negative with respect to its nearest emitter/collector region, to thereby reduce the minority carrier concentration in the bulk base region; and during step 3), using a diode to block current which would tend to turn on conduction in a direction opposite to that of step 1).

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

Note that the claimed inventions can also be applied other double-base bipolar conduction devices, such as the "MTRAN" described in WO/2016-064923, which is hereby incorporated by reference.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

Those of ordinary skill in the relevant fields of art will recognize that other inventive concepts may also be directly or inferentially disclosed in the foregoing. NO inventions are disclaimed. The claims as filed are intended to be as comprehensive as possible, and NO subject matter is intentionally relinquished, dedicated, or abandoned.

What is claimed is:

1. A method for operating a bidirectional bipolar power transistor which has two distinct n-type emitter/collector regions on opposite faces of a p-type semiconductor die, and two distinct p-type base contact regions on the opposite faces of the die, comprising:
   1) in a transistor-ON timing phase, when minimal voltage drop is desired, biasing a first one of the base contact regions, which is closest to whichever of the emitter/collector regions is more positive at the moment, to a voltage which causes bipolar conduction, to thereby reduce the voltage drop between the two emitter/collector regions; and thereafter
   2) in a first pre-turnoff timing phase, shorting each of the base contact regions to the respectively nearest one of the emitter/collector regions, to thereby increase the voltage drop between the two emitter/collector regions; and thereafter
   3) in a second pre-turnoff timing phase, biasing the second base contact regions negative with respect to its nearest emitter/collector region, to thereby reduce the minority carrier concentration in the bulk base region.

2. The method of claim 1, wherein step 3) has a shorter duration than does step 2).

3. The method of claim 1, wherein the semiconductor die is silicon.

4. A gate driving circuit which is connected to a double-base bidirectional bipolar power transistor, and which is configured to implement the methods of claim 1.

5. A gate driving circuit which is connected to a double-base bidirectional bipolar power transistor, and which is configured to implement the methods of claim 1, and which includes a Schottky barrier diode which is connected to block turn-on of reverse conduction during periods of negative base drive.

6. A method for operating a bidirectional bipolar power transistor which has two distinct n-type emitter/collector regions on opposite faces of a p-type semiconductor die, and two distinct p-type base contact regions on the opposite faces of the die, comprising, when a first one of the emitter/collector regions is more positive than a second one of the emitter/collector regions:
   0) in a diode-ON timing phase, shorting a first one of the base contact regions to the first emitter/collector region, which is the nearest thereto, to thereby initiate conduction between the two emitter/collector regions; and thereafter
   1) in a transistor-ON timing phase, when minimal voltage drop is desired, biasing the first base contact region to a voltage which causes bipolar conduction, to thereby reduce the voltage drop between the two emitter/collector regions; and thereafter 2) in a first pre-turnoff timing phase, shorting each of the base contact regions to the respectively nearest one of the emitter/collector regions, to thereby increase the voltage drop between the two emitter/collector regions; and thereafter 3) in a second pre-turnoff timing phase, biasing the second base contact regions negative with respect to the second emitter/collector region; and thereafter 4) shorting the second base contact region to the second emitter/collector region, to keep the device turned off.

7. The method of claim 6, wherein step 3) has a shorter duration than step 2).

8. The method of claim 6, wherein the semiconductor die is silicon.

9. A gate driving circuit which is connected to a double-base bidirectional bipolar power transistor, and which is configured to implement the methods of claim 6.

10. A gate driving circuit which is connected to a double-base bidirectional bipolar power transistor, and which is configured to implement the methods of claim 6, and which includes a Schottky barrier diode which is connected to block turn-on of reverse conduction during periods of negative base drive.

11. A method for operating a bidirectional bipolar transistor which has two first-conductivity-type emitter/collector regions in distinct locations separated by a bulk second-conductivity-type base region, and two distinct second-conductivity-type base contact regions which connect to the bulk base region in mutually separate locations, comprising:
1) in a transistor-ON timing phase, when minimal voltage drop is desired, biasing a first one of the base contact regions, which is closer than a second one of the base contact regions to whichever of the emitter/collector regions is positioned to act as the collector, as defined by externally applied voltage polarity, to a voltage which causes bipolar conduction to reduce the voltage drop between the two emitter/collector regions; and thereafter
2) in a first pre-turnoff timing phase, shorting each of the base contact regions to the respectively nearest one of the emitter/collector regions; and thereafter
3) in a second pre-turnoff timing phase, biasing the second base contact regions with a polarity opposite to that applied to the first base contact region in step 1), to thereby reduce the minority carrier concentration in the bulk base region; and thereafter
4) turning the device off.

12. The method of claim 11, wherein the first conductivity type is n-type.

13. The method of claim 11, wherein step 3) has a shorter duration than step 2).

14. The method of claim 11, wherein the semiconductor die is silicon.

15. A gate driving circuit which is connected to a double-base bidirectional bipolar power transistor, and which is configured to implement the methods of claim 11.

16. A gate driving circuit which is connected to a double-base bidirectional bipolar power transistor, and which is configured to implement the methods of claim 11, and which includes a Schottky barrier diode which is connected to block turn-on of reverse conduction during periods of negative base drive.

17. A method for operating a bidirectional bipolar power transistor which has two distinct n-type emitter/collector regions on opposite faces of a p-type semiconductor die, and two distinct p-type base contact regions on the opposite faces of the die, comprising:
1) in a transistor-ON timing phase, when minimal voltage drop is desired, biasing a first one of the base contact regions, which is closest to whichever of the emitter/collector regions is more positive at the moment, to a voltage which causes bipolar conduction, to thereby reduce the voltage drop between the two emitter/collector regions; and thereafter
2) in a first pre-turnoff timing phase, shorting each of the base contact regions to the respectively nearest one of the emitter/collector regions, to thereby increase the voltage drop between the two emitter/collector regions; and thereafter
3) in a second pre-turnoff timing phase, biasing a second one of the base contact regions negative with respect to its nearest emitter/collector region, to thereby reduce the minority carrier concentration in the bulk base region; and
during step 3), using a diode to block current which would tend to turn on conduction in a direction opposite to that of step 1).

18. The method of claim 17, wherein step 3) has a shorter duration than step 2).

19. The method of claim 17, wherein the semiconductor die is silicon.

20. A gate driving circuit which is connected to a double-base bidirectional bipolar power transistor, and which is configured to implement the methods of claim 17.

21. A gate driving circuit which is connected to a double-base bidirectional bipolar power transistor, and which is configured to implement the methods of claim 17, and which includes a Schottky barrier diode which is connected to block turn-on of reverse conduction during periods of negative base drive.

* * * * *